United States Patent
Daimon et al.

(10) Patent No.: US 11,824,513 B2
(45) Date of Patent: Nov. 21, 2023

(54) ACOUSTIC WAVE DEVICE

(71) Applicant: Murata Manufacturing Co., Ltd., Nagaokakyo (JP)

(72) Inventors: Katsuya Daimon, Nagaokakyo (JP); Yasumasa Taniguchi, Nagaokakyo (JP); Koji Yamamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 170 days.

(21) Appl. No.: 17/679,403

(22) Filed: Feb. 24, 2022

(65) Prior Publication Data

US 2022/0182035 A1   Jun. 9, 2022

Related U.S. Application Data

(63) Continuation of application No. PCT/JP2020/023596, filed on Jun. 16, 2020.

(30) Foreign Application Priority Data

Aug. 29, 2019 (JP) .................................. 2019-156890

(51) Int. Cl.
*H03H 9/02* (2006.01)

(52) U.S. Cl.
CPC .... *H03H 9/02228* (2013.01); *H03H 9/02015* (2013.01)

(58) Field of Classification Search
CPC .................. H03H 9/02228; H03H 9/02015
See application file for complete search history.

(56) References Cited

U.S. PATENT DOCUMENTS

| 2014/0191619 A1 | 7/2014 | Ito et al. |
| 2015/0115771 A1* | 4/2015 | Konoma ............... C30B 29/52 |
| | | 117/106 |
| 2019/0229702 A1* | 7/2019 | Chen ....................... H03H 3/08 |

(Continued)

FOREIGN PATENT DOCUMENTS

| JP | 2003-152498 A | 5/2003 |
| JP | 2003-258594 A | 9/2003 |

(Continued)

OTHER PUBLICATIONS

Official Communication issued in International Patent Application No. PCT/JP2020/023596, dated Aug. 11, 2020.

*Primary Examiner* — Samuel S Outten
(74) *Attorney, Agent, or Firm* — KEATING & BENNETT, LLP

(57) ABSTRACT

An acoustic wave device includes a piezoelectric substrate and an IDT electrode on the piezoelectric substrate. The IDT electrode includes first and second electrode fingers. When the propagation direction of acoustic waves is a first direction and the direction orthogonal or substantially orthogonal to the first direction is a second direction, an intersecting region of the IDT electrode includes a central region located toward the middle in the second direction and first and second edge regions on both sides in the second direction of the central region. The first and second electrode fingers include epitaxially grown oriented films in the central region and portions that do not include the oriented films in the first and second edge regions.

20 Claims, 5 Drawing Sheets

(56) References Cited

U.S. PATENT DOCUMENTS

2020/0076404 A1 3/2020 Takigawa
2020/0328727 A1 10/2020 Daimon

FOREIGN PATENT DOCUMENTS

| WO | 2012/128268 A1 | 9/2012 |
| WO | 2019139076 A1 | 7/2018 |
| WO | 2018/216548 A1 | 11/2018 |

* cited by examiner

ACOUSTIC WAVE DEVICE

CROSS REFERENCE TO RELATED APPLICATIONS

This application claims the benefit of priority to Japanese Patent Application No. 2019-156890 filed on Aug. 29, 2019 and is a Continuation Application of PCT Application No. PCT/JP2020/023596 filed on Jun. 16, 2020. The entire contents of each application are hereby incorporated herein by reference.

BACKGROUND OF THE INVENTION

1. Field of the Invention

The present invention relates to an acoustic wave device.

2. Description of the Related Art

Conventionally, an acoustic wave device is widely used as a filter of a mobile phone and the like. Japanese Unexamined Patent Application Publication No. 2003-258594 discloses an example of an acoustic wave device. The interdigital transducer (IDT) electrode of this acoustic wave device includes a base electrode layer and an Al electrode layer provided on the base electrode layer. The Al electrode layer is an epitaxially grown oriented film. The electric power handling capability is enhanced by using such an oriented film.

However, when the oriented film that has been epitaxially grown across the entire length direction of an electrode finger is included as in the acoustic wave device described in Japanese Unexamined Patent Application Publication No. 2003-258594, electrode destruction may occur particularly in the end portions of the electrode fingers to which large electric power is likely to be applied momentarily.

SUMMARY OF THE INVENTION

Preferred embodiments of the present invention provide acoustic wave devices that each have an improved electric power handling capability and that are each unlikely to suffer electrode destruction due to momentary application of electric power.

An acoustic wave device according to a preferred embodiment of the present invention includes a piezoelectric substrate, and an IDT electrode on the piezoelectric substrate. The IDT electrode includes a first busbar and a second busbar facing each other, a plurality of first electrode fingers with one ends connected to the first busbar, and a plurality of second electrode fingers with one ends connected to the second busbar, the plurality of first electrode fingers and the plurality of second electrode fingers are interdigitated with each other. When a propagation direction of acoustic waves is a first direction and a direction orthogonal or substantially orthogonal to the first direction is a second direction, a portion in which the first electrode fingers overlap with the second electrode fingers as viewed in the first direction is an intersecting region including a central region located towards a middle in the second direction, a first edge region in a portion of the central region closer to the first busbar than to the second busbar, and a second edge region in a portion of the central region closer to the second busbar than to the first busbar. The first electrode fingers and the second electrode fingers include epitaxially grown oriented films in the central region. The first electrode fingers and the second electrode fingers include portions that do not include the oriented films in the first edge region and the second edge region.

According to preferred embodiments of the present invention, it is possible to provide acoustic wave devices that each have an improved electric power handling capability and that are each unlikely to suffer electrode destruction due to momentary application of electric power.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

Preferred embodiments described herein are examples and partial substitutions or combinations of the structures are possible between different preferred embodiments.

Figure 1:
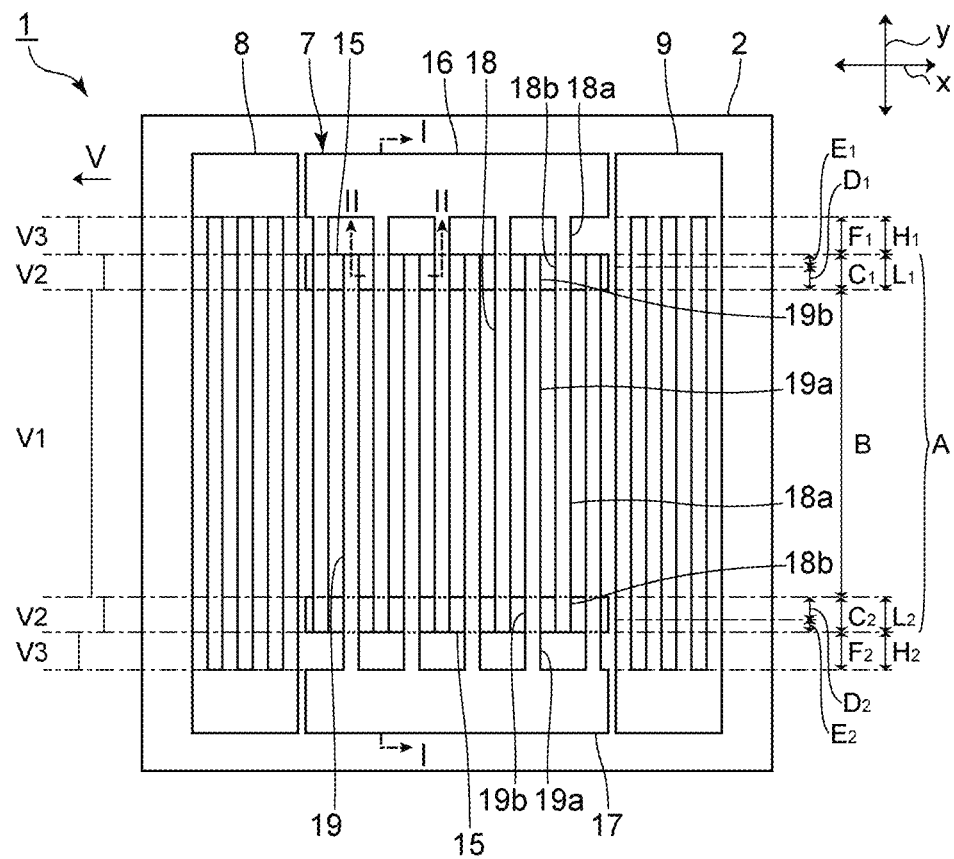
FIG. 1 is a plan view of an acoustic wave device according to a first preferred embodiment of the present invention.

FIG. 1 is a plan view of an acoustic wave device according to a first preferred embodiment of the present invention.

An acoustic wave device 1 includes a piezoelectric substrate 2. An IDT electrode 7 is provided on the piezoelectric substrate 2. Acoustic waves are excited by applying an AC voltage to the IDT electrode 7. Here, the propagation direction of acoustic waves is a first direction x and the direction orthogonal or substantially orthogonal to the first direction x is a second direction y. A pair of reflectors 8 and 9 are provided on both sides in the first direction x of the IDT electrode 7 on the piezoelectric substrate 2.

The IDT electrode 7 includes a first busbar 16 and a second busbar 17 that face each other, a plurality of first electrode fingers 18, and a plurality of second electrode fingers 19. One ends of the plurality of first electrode fingers 18 are connected to the first busbar 16. One ends of the plurality of second electrode fingers 19 are connected to the second busbar 17. The plurality of first electrode fingers 18 and the plurality of second electrode fingers 19 are interdigitated with each other.

Each of the IDT electrode 7, the reflector 8, and the reflector 9 includes a laminated metal film in which, for example, a Ti layer, an AlCu layer, and a Ti layer are laminated in this order from the piezoelectric substrate 2. However, the materials of the IDT electrode 7, the reflector 8, and the reflector 9 are not limited to the ones described above. For example, an Al layer may be used instead of the AlCu layer. The IDT electrode 7, the reflector 8, and the reflector 9 may be made from a single-layer metal film.

In the IDT electrode 7, the portion in which the first electrode finger 18 overlaps with the second electrode finger 19 as viewed in the first direction x is an intersecting region A. The intersecting region A includes a central region B located towards the middle in the second direction y.

The intersecting region A includes a first edge region $C_1$ disposed in the portion of the central region B closer to the first busbar 16 than to the second busbar 17 and a second edge region $C_2$ disposed in the portion of the central region B closer to the second busbar 17 than to the first busbar 16. The first edge region $C_1$ includes a first end region $E_1$ including the ends of the plurality of second electrode fingers 19 and a first inner edge region $D_1$ located on the inner side in the second direction y of the first end region $E_1$. The second edge region $C_2$ includes a second end region $E_2$ including the ends of the plurality of first electrode fingers 18 and a second inner edge region $D_2$ located on the inner side in the second direction y of the second end region $E_2$.

The IDT electrode 7 includes a first gap region $F_1$ located between the first edge region $C_1$ and the first busbar 16 and a second gap region $F_2$ located between the second edge region $C_2$ and the second busbar 17. The first edge region $C_1$, the second edge region $C_2$, the first gap region $F_1$, and the second gap region $F_2$ extend in the first direction x. The first end region $E_1$ and the first inner edge region $D_1$ of the first edge region $C_1$ and the second end region $E_2$ and the second inner edge region $D_2$ of the second edge region $C_2$ also extend in the first direction x.

Figure 2:
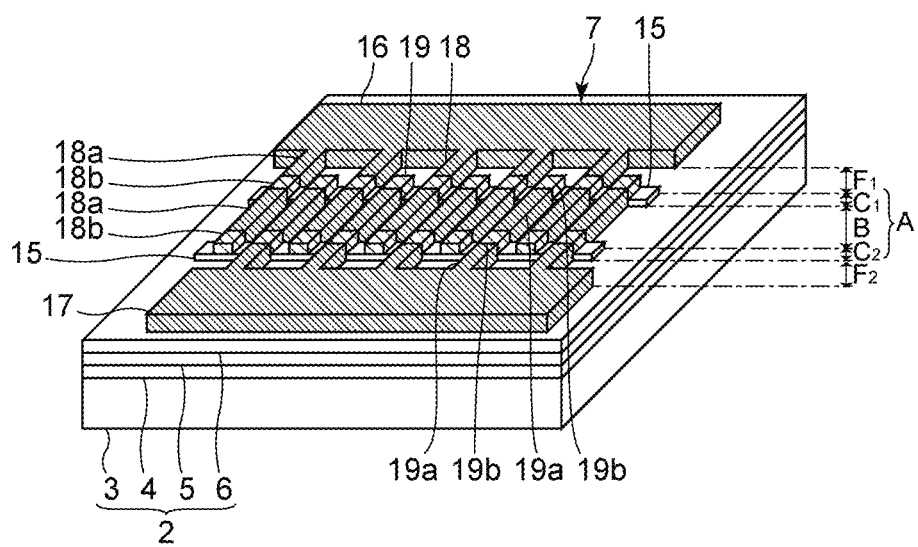
FIG. 2 is a perspective view illustrating the vicinity of an IDT electrode of the acoustic wave device according to the first preferred embodiment of the present invention.
Figure 3:
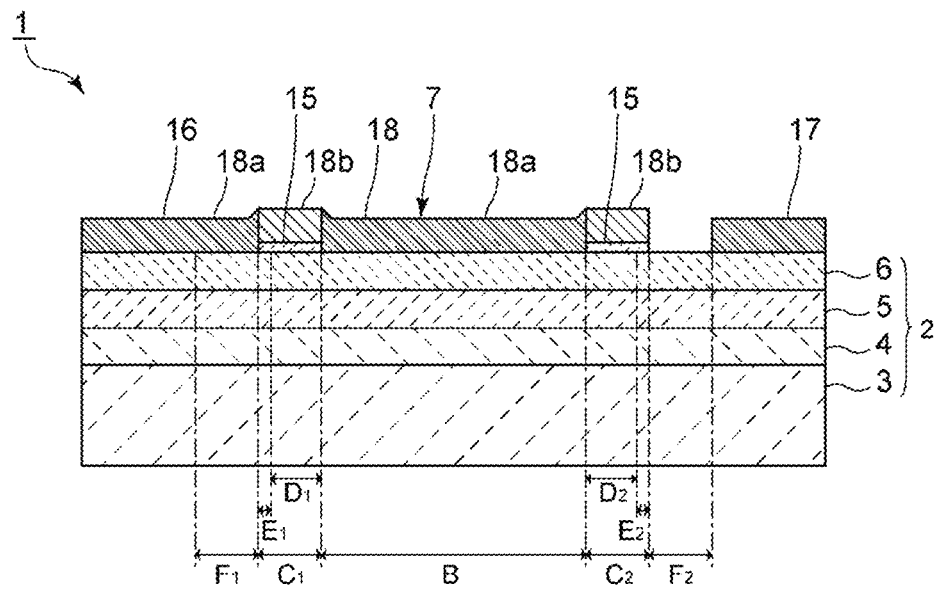
FIG. 3 is a sectional view taken along line I-I in FIG. 1.

FIG. 2 is a perspective view illustrating the vicinity of the IDT electrode of the acoustic wave device according to the first preferred embodiment. FIG. 3 is a sectional view taken along line I-I in FIG. 1. It should be noted that the IDT electrode 7 is illustrated by hatching in FIG. 2. This is also true of other perspective views.

As illustrated in FIG. 2 and FIG. 3, each of the first electrode fingers 18 includes a first portion 18a that includes the epitaxially grown oriented film and a second portion 18b that does not include the epitaxially grown oriented film. More specifically, the second portion 18b of the first electrode finger includes, for example, an uniaxially orientated crystalline film, a non-oriented polycrystalline film, and the like. In the present preferred embodiment, the first portion 18a is located in the central region B and the first gap region $F_1$. The second portion 18b is located across the first edge region $C_1$ and the second edge region $C_2$.

Similarly, as illustrated in FIG. 1 and FIG. 2, each of the second electrode fingers 19 includes a first portion 19a that includes the epitaxially grown oriented film and a second portion 19b that does not include the epitaxially grown oriented film. More specifically, the second portion 19b of the second electrode finger 19 includes, for example, an uniaxially orientated crystalline film, a non-oriented polycrystalline film, and the like. In the present preferred embodiment, the first portion 19a is located in the central region B and the second gap region $F_2$. The second portion 19b is located across the first edge region $C_1$ and the second edge region $C_2$.

In the present preferred embodiment, each of the first busbar 16 and the second busbar 17 includes the epitaxially grown oriented film. However, the first busbar 16 and the second busbar 17 do not need to include the epitaxially grown oriented film. The first busbar 16 and the second busbar 17 may include, for example, an uniaxially orientated crystalline film, a non-oriented polycrystalline film, and the like.

As described above, the IDT electrode 7 according to the present preferred embodiment includes a laminated metal film in which, for example, a Ti layer, an AlCu layer, and a Ti layer are laminated. Any of the Ti layer, the AlCu layer, and the Ti layer of the first portion 18a of the first electrode finger 18 and the first portion 19a of the second electrode finger 19 includes the epitaxially grown oriented film. In contrast, any of the Ti layer, the AlCu layer, and the Ti layer of the second portion 18b of the first electrode finger 18 and the second portion 19b of the second electrode finger 19 includes, for example, an uniaxially orientated crystalline film, a non-oriented polycrystalline film, and the like. It should be noted that the epitaxially grown oriented film represents a polycrystalline film that has a twin-crystal structure in this specification.

Figure 4:
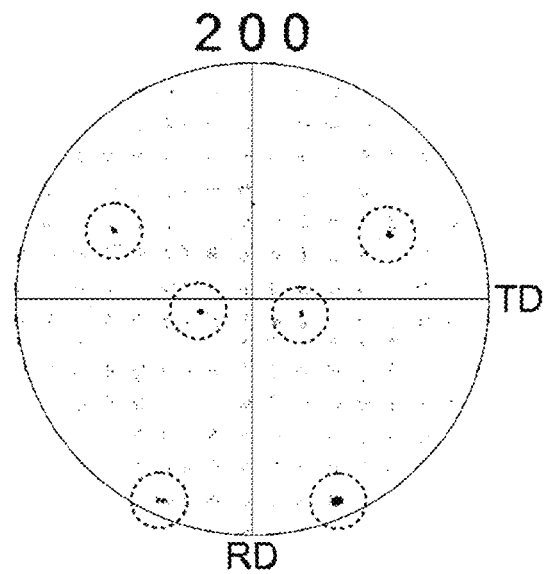
FIG. 4 is an X-ray diffraction pole figure of an epitaxially grown oriented film.

FIG. 4 is an X-ray diffraction pole figure of the epitaxially grown oriented film. The X-ray diffraction pole figure of the (200) plane of the Al layer is illustrated in FIG. 4.

As described above, the epitaxially grown oriented film has a twin-crystal structure. Accordingly, when the pole measurement of the epitaxially grown oriented film is performed by X-ray diffraction, the diffraction pattern includes a plurality of symmetry centers, as illustrated by the dashed circles in FIG. 4.

Figure 5:
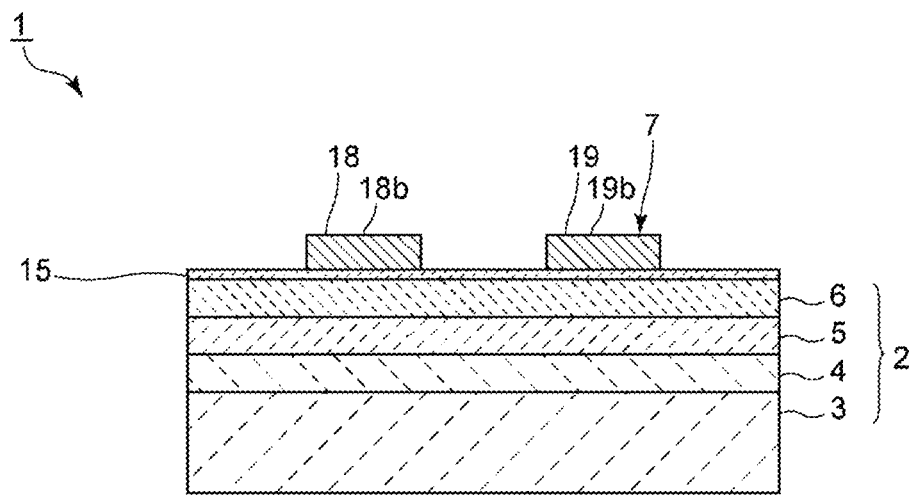
FIG. 5 is a sectional view taken along line II-II in FIG. 1.

FIG. 5 is a sectional view taken along line II-II in FIG. 1.

In the first edge region $C_1$, a dielectric film 15 is provided between the first and second electrode fingers 18 and 19 and the piezoelectric substrate 2. More specifically, the dielectric film 15 is provided across the first edge region $C_1$. Similarly, as illustrated in FIG. 2, the dielectric film 15 is provided between the first and second electrode fingers 18 and 19 and the piezoelectric substrate 2 across the second edge region $C_2$. In the present preferred embodiment, the dielectric film 15 has a zonal shape extending in the first direction x. The dielectric film 15 is, for example, a tantalum oxide film. However, the material of the dielectric film 15 is not limited to the material described above and may be, for example, hafnium oxide or tellurium oxide. The acoustic wave device 1 does not necessarily include the dielectric film 15.

In the present preferred embodiment, the first portion 18a of the first electrode finger 18 and the first portion 19a of the second electrode finger 19 are provided directly on the piezoelectric substrate 2. The second portion 18b of the first electrode finger 18 and the second portion 19b of the second electrode finger 19 are provided indirectly on the piezoelectric substrate 2 with the dielectric film 15 interposed therebetween. However, the second portion 18b of the first electrode finger 18 and the second portion 19b of the second electrode finger 19 may be provided directly on the piezoelectric substrate 2.

As illustrated in FIG. 1, in the first edge region $C_1$ and the second edge region $C_2$, the first electrode finger 18 and the second electrode finger 19 are laminated on the dielectric film 15. As a result, the acoustic velocity in the first edge region $C_1$ and the second edge region $C_2$ is lower than the acoustic velocity in the central region B. As described above, a first low acoustic velocity region $L_1$ is provided in the first edge region $C_1$ and a second low acoustic velocity region $L_2$ is provided in the second edge region $C_2$.

Here, when the acoustic velocity in the central region B is V1 and the acoustic velocity in the first low acoustic velocity region $L_1$ and the second low acoustic velocity region $L_2$ is V2, $V2<V1$ is satisfied.

In the first gap region $F_1$, only the plurality of first electrode fingers 18 of the plurality of first electrode fingers 18 and the plurality of second electrode fingers 19 are provided. Accordingly, the acoustic velocity in the first gap region $F_1$ is higher than the acoustic velocity in the central region B. As described above, a first high acoustic velocity region $H_1$ is provided in the first gap region $F_1$.

Similarly, in the second gap region $F_2$, only the plurality of second electrode fingers 19 of the plurality of first electrode fingers 18 and the plurality of second electrode fingers 19 are provided. Accordingly, the acoustic velocity in the second gap region $F_2$ is higher than the acoustic velocity in the central region B. As described above, a second high acoustic velocity region $H_2$ is provided in the second gap region $F_2$. Here, when the acoustic velocity in the first high acoustic velocity region $H_1$ and the second high acoustic velocity region $H_2$ is V3, $V1<V3$ is satisfied.

The relationship between the acoustic velocities in these regions is indicated by $V2<V1<V3$. The relationship between the acoustic velocities as described above is illustrated in FIG. 1. In the portion indicating the relationship of the acoustic velocities in FIG. 1, the line indicating the height of the acoustic velocity located on the leftmost side indicates the highest acoustic velocity as indicated by arrow V.

In the second direction y, the central region B, the first low acoustic velocity region $L_1$, and the first high acoustic velocity region $H_1$ are disposed in this order. Similarly, in the second direction y, the central region B, the second low acoustic velocity region $L_2$, and the second high acoustic velocity region $H_2$ are disposed in this order. By causing a piston mode due to the difference between the acoustic velocities in these regions, a spurious response due to a transverse mode can be reduced or prevented. The acoustic wave device 1 does not necessarily include the first low acoustic velocity region $L_1$, the second low acoustic velocity region $L_2$, the first high acoustic velocity region $H_1$, and the second high acoustic velocity region $H_2$.

As illustrated in FIG. 5, the piezoelectric substrate 2 is a laminated substrate in which a support substrate 3, a high velocity film 4 as the high velocity material layer, a low velocity film 5, and a piezoelectric layer 6 are laminated in this order. The IDT electrode 7 described above is provided on the piezoelectric layer 6. In the present preferred embodiment, the piezoelectric layer 6 is, for example, a lithium tantalate layer. The material of the piezoelectric layer 6 is not limited to the material described above and may be, for example, lithium niobate, zinc oxide, aluminum nitride, quartz, PZT, or the like.

The low velocity film 5 is a relatively low velocity film. More specifically, the acoustic velocity of bulk waves propagating through the low velocity film 5 is lower than the acoustic velocity of bulk waves propagating through the piezoelectric layer 6. In the present preferred embodiment, the low velocity film 5 is, for example, a silicon oxide film. Silicon oxide can be represented by $SiO_x$. Here, x is any positive number. In the present preferred embodiment, the low velocity film 5 is, for example, a $SiO_2$ film. The material of the low velocity film 5 is not limited to the material described above and may be, for example, glass, silicon oxynitride, tantalum oxide, or a material including, as a main component, a compound obtained by adding fluorine, carbon, or boron to silicon oxide.

The high velocity material layer is a relatively high velocity layer. More specifically, the acoustic velocity of bulk waves propagating through the high velocity material layer is higher than the acoustic velocity of acoustic waves propagating through the piezoelectric layer 6. In the present preferred embodiment, the high velocity material layer is the high velocity film 4. The high velocity film 4 of the acoustic wave device 1 is, for example, a silicon nitride film. The material of the high velocity film 4 is not limited to the material described above and may be, for example, aluminum oxide, silicon carbide, silicon oxynitride, silicon, sapphire, lithium tantalate, lithium niobate, quartz, alumina, zirconia, cordierite, mullite, steatite, forsterite, magnesia, diamond-like carbon (DLC) film, diamond, or a medium including the material described above as a main component.

The support substrate 3 is, for example, a silicon substrate in the present preferred embodiment. The material of the support substrate 3 is not limited to the material described above and may be, for example, a piezoelectric material such as aluminum oxide, lithium tantalate, lithium niobate, or quartz, various ceramics such as alumina, magnesia, silicon nitride, aluminum nitride, silicon carbide, zirconia, cordierite, mullite, steatite, or forsterite, a dielectric such as sapphire, diamond, or glass, a semiconductor such as gallium nitride, or resin.

The acoustic wave device 1 according to the present preferred embodiment has a laminated structure in which the high velocity film 4, the low velocity film 5, and the piezoelectric layer 6 are laminated in this order, such that the energy of acoustic waves can be effectively confined to the piezoelectric layer 6 side. The piezoelectric substrate 2 may be a piezoelectric substrate including only the piezoelectric layer 6.

The present preferred embodiment has the following structure. 1) In the central region B, the first electrode finger 18 and the second electrode finger 19 include the first portion 18a and the first portion 19a that include the epitaxially grown oriented films. 2) In the first edge region $C_1$ and the second edge region $C_2$, the first electrode finger 18 and the second electrode finger 19 include the second portion 18b and the second portion 19b that do not include the epitaxially grown oriented films. Accordingly, electric power handling capability is improved and electrode destruction due to the momentary application of electric power is unlikely to occur. This will be described below.

The excitation intensity of the IDT electrode 7 is large particularly in the central region B. Accordingly, the IDT electrode 7 is likely to be destroyed particularly in the central region B when a certain electric power is continuously applied. In contrast, in the present preferred embodiment, the first electrode finger 18 and the second electrode finger 19 include the first portion 18a and the first portion 19a that include the epitaxially grown oriented films in the central region B. This can improve electric power handling capability. More specifically, it is possible to increase the durability of the IDT electrode 7 against the continuous application of certain electric power.

In the IDT electrode 7, large electric power is likely to be momentarily applied in the first edge region $C_1$ and the second edge region $C_2$ in which the vicinity of the ends of the electrode fingers is located. In contrast, in the present preferred embodiment, in the first edge region $C_1$ and the second edge region $C_2$, the first electrode finger 18 includes the second portion 18b that does not include the epitaxially grown oriented film and the second electrode finger 19 includes the second portion 19b that does not include the epitaxially grown oriented film. This can increase the durability of the IDT electrode 7 in the first edge region $C_1$ and the second edge region $C_2$ against the momentary application of electric power. Accordingly, in the present preferred embodiment, electrode destruction is unlikely to occur when large electric power is momentarily applied.

Here, the materials and design parameters in the individual components of the acoustic wave device 1 according to the present preferred embodiment will be described below. However, the materials and design parameters described below are examples and are not limited to those described below. The wavelength defined by the electrode finger pitch of the IDT electrode 7 is denoted as X. The electrode finger pitch is the distance between the center lines of the first electrode finger 18 and the second electrode finger 19 adjacent to each other. It is assumed that the dimension of the intersecting region A of the IDT electrode 7 along the second direction y is the crossing width.

Support substrate 3: material is silicon (Si), plane orientation is (111).

High velocity film 4: material is silicon nitride (SiN), film thickness is about 300 nm.

Low velocity film 5: material is $SiO_2$, film thickness is about 300 nm.

Piezoelectric layer 6: material is lithium tantalate ($LiTaO_3$), film thickness is about 400 nm.

Dielectric film 15: material is tantalum oxide ($Ta_2O_5$), film thickness is about 30 nm.

IDT electrode 7: material includes Ti, AlCu, and Ti in order from piezoelectric substrate 2, film thicknesses are about 12 nm, about 100 nm, and about 4 nm in order from piezoelectric substrate 2.

Wavelength λ of IDT electrode 7: about 2 μm

Duty of IDT electrode 7: about 0.5

Number of pairs of first electrode finger 18 and second electrode finger 19 of IDT electrode 7: 100 pairs Crossing width of IDT electrode 7: about 40 μm In the present preferred embodiment, the first busbar 16 and the second busbar 17 include the epitaxially grown oriented films. However, the first busbar 16 and the second busbar 17 do not need to include the epitaxially grown oriented films. The first busbar 16 and the second busbar 17 may include, for example, an uniaxially orientated crystalline film, a non-oriented polycrystalline film, and the like.

The IDT electrode 7 can be formed by, for example, a photolithography method. More specifically, the first busbar 16, the second busbar 17, the first portion 18a of the first electrode finger 18, and the first portion 19a of the second electrode finger 19 are formed on the piezoelectric substrate 2 by, for example, a photolithography method or the like. At this time, the Ti layer, the AlCu layer, and the Ti layer of the first busbar 16, the second busbar 17, the first portion 18a of the first electrode finger 18, and the first portion 19a of the second electrode finger 19 are formed by epitaxial growth.

Next, the second portion 18b of the first electrode finger 18 and the second portion 19b of the second electrode finger 19 are formed by, for example, a photolithography method or the like. At this time, the Ti layer, the AlCu layer, and the Ti layer of the second portion 18b of the first electrode finger 18 and the second portion 19b of the second electrode finger 19 are formed without using epitaxial growth.

In manufacturing the acoustic wave device 1 including the dielectric film 15 as in the present preferred embodiment, the dielectric film 15 is preferably formed before the IDT electrode 7 is formed.

Here, the dimensions along the first direction x of the first electrode finger 18 and the second electrode finger 19 are assumed to be the widths. The widths of the first electrode finger 18 and the second electrode finger 19 are constant or substantially constant in the present preferred embodiment. The first electrode finger 18 of the IDT electrode 7 may include a wide portion with a width larger than the portion located in the central region B, in the portion located in at least one of the first edge region $C_1$ and the second edge region $C_2$. Similarly, the second electrode finger 19 may include a wide portion in the portion located in at least one of the first edge region $C_1$ and the second edge region $C_2$. This may define the first low acoustic velocity region $L_1$ and the second low acoustic velocity region $L_2$.

Figure 6:
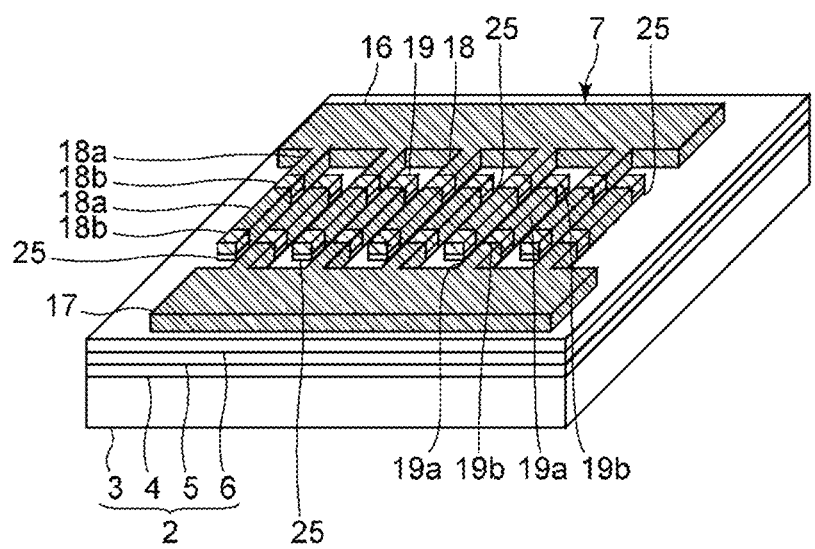
FIG. 6 is a perspective view illustrating the vicinity of an IDT electrode of an acoustic wave device according to a first modification of the first preferred embodiment of the present invention.

The dielectric film 15 according to the present preferred embodiment has, for example, a zonal shape, but the shape of the dielectric film 15 is not limited to this. In a first modification of the first preferred embodiment illustrated in FIG. 6, a plurality of dielectric films 25 are provided in each of the first edge region $C_1$ and the second edge region $C_2$. In the first edge region $C_1$ and the second edge region $C_2$, the first electrode finger 18 or the second electrode finger 19 is provided on each of the dielectric films 25.

As described above, in the piezoelectric substrate 2 according to the first preferred embodiment, the piezoelectric layer 6 is provided indirectly on the high velocity film 4 as the high velocity material layer with the low velocity film 5 interposed therebetween. However, the structure of the piezoelectric substrate 2 is not limited to the structure described above. Second to fourth modifications of the first preferred embodiment in which only the structure of the piezoelectric substrate is different from that of the first preferred embodiment will be described below. In the second to fourth modifications, as in the first preferred embodiment, the electric power handling capability can be improved and the electrode destruction is unlikely to occur due to momentary application of electric power. In addition, the energy of acoustic waves can be effectively confined to the piezoelectric layer side.

Figure 7:
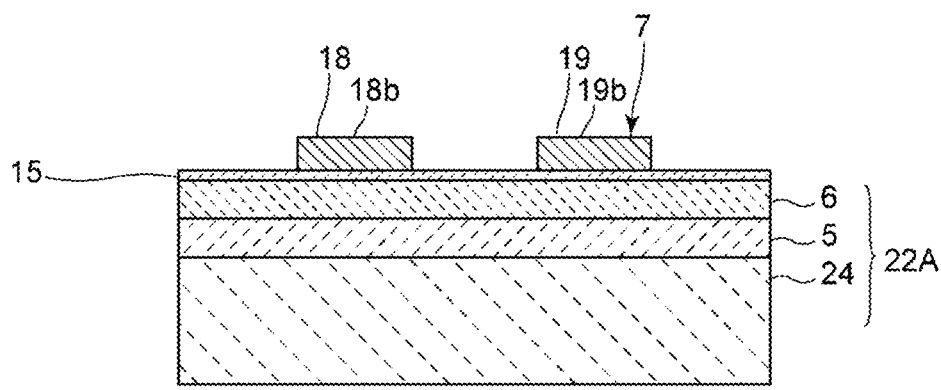
FIG. 7 is a sectional view illustrating a portion corresponding to the cross section taken along line II-II in FIG. 1 of an acoustic wave device according to a second modification of the first preferred embodiment of the present invention.

In the second modification illustrated in FIG. 7, the high velocity material layer is a high velocity support substrate 24. A piezoelectric substrate 22A includes the high velocity support substrate 24, the low velocity film 5 provided on the high velocity support substrate 24, and the piezoelectric layer 6 provided on the low velocity film 5.

The material of the high velocity support substrate 24 may be, for example, aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, DLC film, diamond, or a medium including the above material as a main component.

Figure 8:
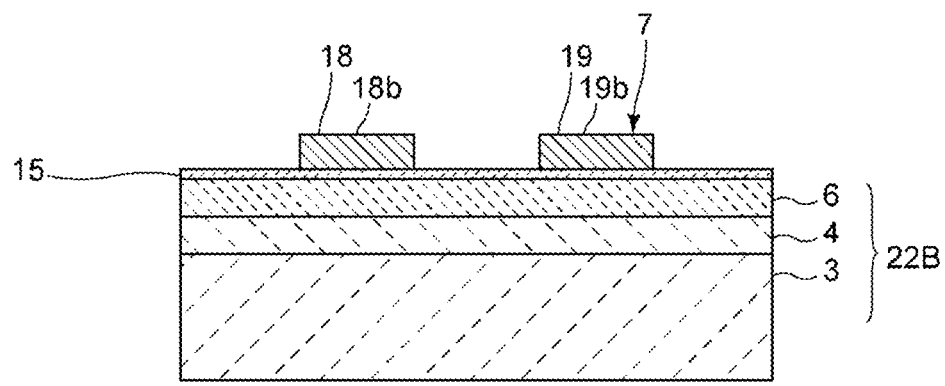
FIG. 8 is a sectional view illustrating a portion corresponding to the cross section taken along line II-II in FIG. 1 of an acoustic wave device according to a third modification of the first preferred embodiment of the present invention.

In the third modification illustrated in FIG. 8, a piezoelectric substrate 22B includes the support substrate 3, the high velocity film 4 provided on the support substrate 3, and the piezoelectric layer 6 provided on the high velocity film 4. In the third modification, the piezoelectric layer 6 is provided directly on the high velocity film 4 as the high velocity material layer.

Figure 9:
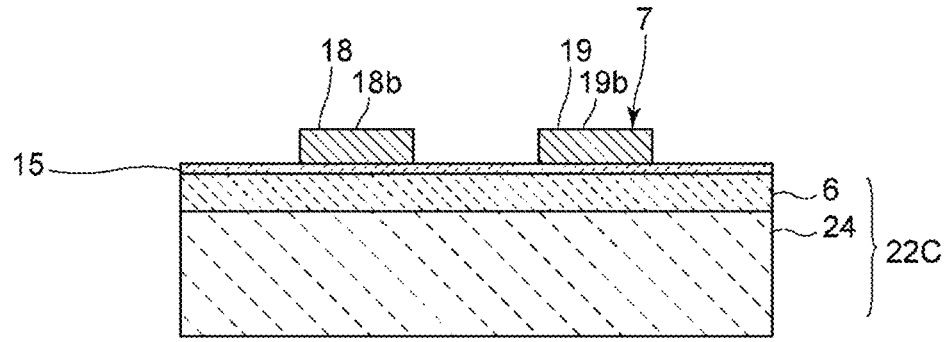
FIG. 9 is a sectional view illustrating a portion corresponding to the cross section taken along line II-II in FIG. 1 of an acoustic wave device according to a fourth modification of the first preferred embodiment of the present invention.

In the fourth modification illustrated in FIG. 9, a piezoelectric substrate 22C includes the high velocity support substrate 24 and the piezoelectric layer 6 provided directly on the high velocity support substrate 24.

Figure 10:
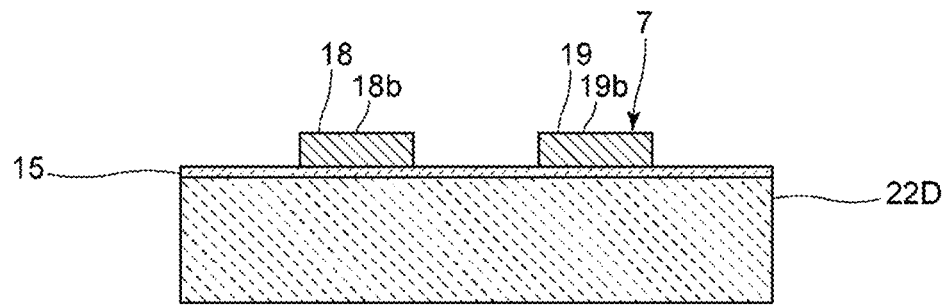
FIG. 10 is a sectional view illustrating a portion corresponding to the cross section taken along line II-II in FIG. 1 of an acoustic wave device according to a fifth modification of the first preferred embodiment of the present invention.

In contrast, in the fifth modification of the first preferred embodiment illustrated in FIG. 10, a piezoelectric substrate 22D includes only a piezoelectric layer. In the fifth modification, as in the first preferred embodiment, the electric power handling capability can be improved and the electrode destruction due to momentary application of electric power is unlikely to occur.

Figure 11:
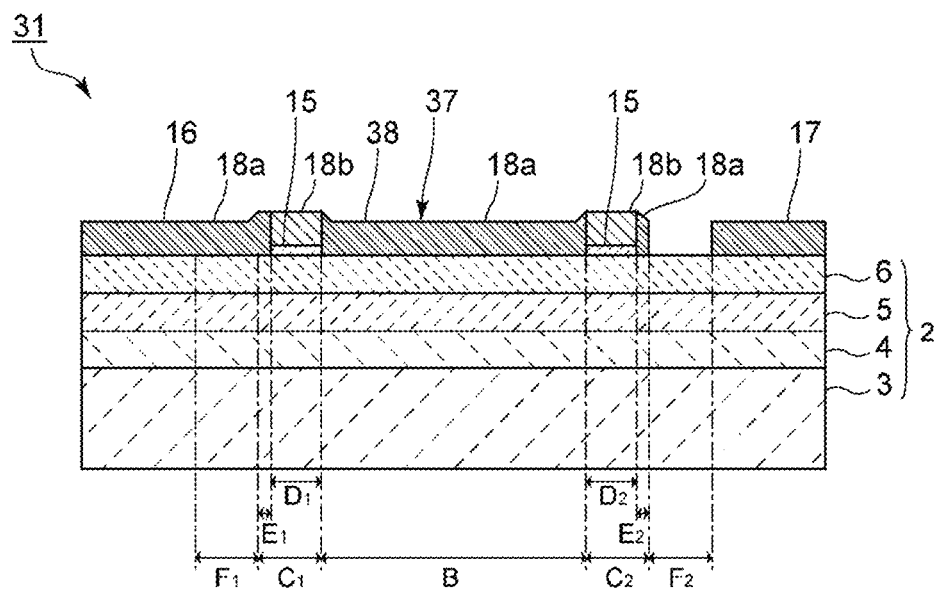
FIG. 11 is a sectional view illustrating a portion corresponding to the cross section taken along line I-I in FIG. 1 of an acoustic wave device according to a second preferred embodiment of the present invention.
Figure 12:
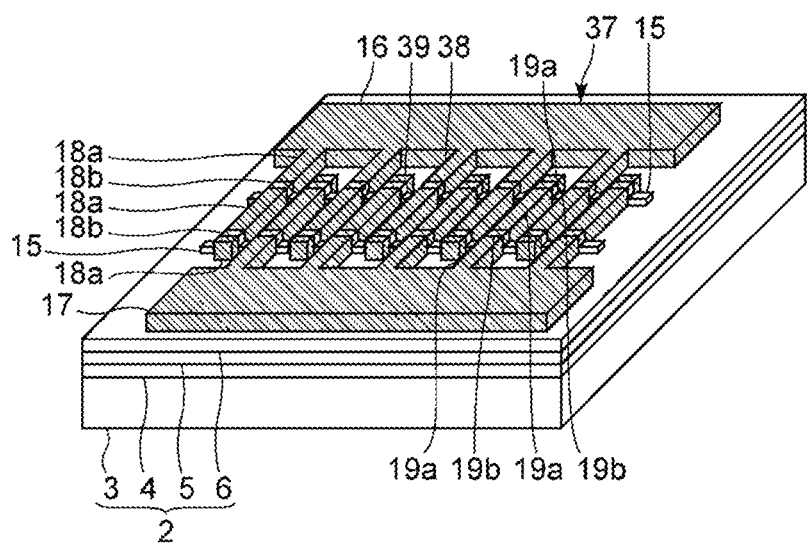
FIG. 12 is a perspective view illustrating the vicinity of an IDT electrode of the acoustic wave device according to the second preferred embodiment of the present invention.

FIG. 11 is a sectional view illustrating a portion corresponding to the cross section taken along line I-I in FIG. 1 of an acoustic wave device according to a second preferred embodiment of the present invention. FIG. 12 is a perspective view illustrating the vicinity of an IDT electrode of the acoustic wave device according to the second preferred embodiment.

As illustrated in FIG. 11 and FIG. 12, the present preferred embodiment is different from the first preferred embodiment in the structures of a first electrode finger 38 and a second electrode finger 39 in the first edge region $C_1$ and the second edge region $C_2$ and the position of the dielectric film 15. An acoustic wave device 31 according to the second preferred embodiment has the same or substantially the same structure as the acoustic wave device 1 according to the first preferred embodiment, except for the points described above.

The first electrode finger 38 of an IDT electrode 37 includes the first portion 18a and the second portion 18b in the first edge region $C_1$ and the second edge region $C_2$. Similarly, the second electrode finger 39 includes the first portion 19a and the second portion 19b in the first edge region $C_1$ and the second edge region $C_2$. More specifically, the first portion 18a of the first electrode finger 38 and the first portion 19a of the second electrode finger 39 are located in the first end region $E_1$ of the first edge region $C_1$ and the second end region $E_2$ of the second edge region $C_2$. The second portion 18b of the first electrode finger 38 and the second portion 19b of the second electrode finger 39 are located in the first inner edge region $D_1$ of the first edge region $C_1$ and the second inner edge region $D_2$ of the second edge region $C_2$.

In the first end region $E_1$ of the first edge region $C_1$ and the second end region $E_2$ of the second edge region $C_2$, the dielectric film 15 is not provided between the first and second electrode fingers 38 and 39 and the piezoelectric substrate 2. In contrast, in the first inner edge region $D_1$ of the first edge region $C_1$ and the second inner edge region $D_2$ of the second edge region $C_2$, the dielectric film 15 is provided between the first and second electrode fingers 38 and 39 and the piezoelectric substrate 2.

In manufacturing the acoustic wave device 31, there may be misalignment in the positional relationship between the dielectric film 15 and the IDT electrode 37 due to manufacturing variations. Even in such a case, the first low acoustic velocity region $L_1$ and the second low acoustic velocity region $L_2$ can be more reliably formed. Accordingly, a spurious response due to a transverse mode can be more reliably reduced or prevented.

In addition, in the present preferred embodiment, the first electrode finger 38 and the second electrode finger 39 include the first portion 18a and the first portion 19a in the central region B and include the second portion 18b and the second portion 19b in the first edge region $C_1$ and the second edge region $C_2$. Accordingly, as in the first preferred embodiment, the electric power handling capability can be improved and the electrode destruction due to momentary application of electric power is unlikely to occur.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substrate; and
an IDT electrode on the piezoelectric substrate; wherein
the IDT electrode includes a first busbar and a second busbar facing each other, a plurality of first electrode fingers with one ends connected to the first busbar, and a plurality of second electrode fingers with one ends connected to the second busbar, the plurality of first electrode fingers and the plurality of second electrode fingers being interdigitated with each other;
when a propagation direction of acoustic waves is a first direction and a direction orthogonal or substantially orthogonal to the first direction is a second direction, a portion in which the first electrode fingers overlap with the second electrode fingers as viewed in the first direction is an intersecting region including a central region located toward a middle in the second direction, a first edge region in a portion of the central region closer to the first busbar than to the second busbar, and a second edge region disposed in a portion of the central region closer to the second busbar than to the first busbar;
the first electrode fingers and the second electrode fingers include epitaxially grown oriented films in the central region; and
the first electrode fingers and the second electrode fingers include portions that do not include the oriented films in the first edge region and the second edge region.

2. The acoustic wave device according to claim 1, wherein a dielectric film is provided in at least a portion of a portion between the first and second electrode fingers and the piezoelectric substrate in the first edge region and the second edge region.

3. The acoustic wave device according to claim 2, wherein
the first edge region includes a first end region including ends of the plurality of second electrode fingers, and the second edge region includes a second end region including ends of the plurality of first electrode fingers; and
the first electrode fingers and the second electrode fingers are directly on the piezoelectric substrate in the first end region and the second end region.

4. The acoustic wave device according to claim 2, wherein
the first edge region includes a first end region including ends of the plurality of second electrode fingers, and the second edge region includes a second end region including ends of the plurality of first electrode fingers; and
the first electrode fingers and the second electrode fingers do not include the oriented films in the first end region and the second end region.

5. The acoustic wave device according to claim 2, wherein the first electrode fingers and the second electrode fingers are directly on the piezoelectric substrate in the central region.

6. The acoustic wave device according to claim 2, wherein a low acoustic velocity region in which an acoustic velocity is lower than in the central region is provided in the first edge region and the second edge region of the IDT electrode.

7. The acoustic wave device according to claim 1, wherein
the first edge region includes a first end region including ends of the plurality of second electrode fingers, and the second edge region includes a second end region including ends of the plurality of first electrode fingers; and
the first electrode fingers and the second electrode fingers are directly on the piezoelectric substrate in the first end region and the second end region.

8. The acoustic wave device according to claim 7, wherein
the first edge region includes a first end region including ends of the plurality of second electrode fingers, and the second edge region includes a second end region including ends of the plurality of first electrode fingers; and
the first electrode fingers and the second electrode fingers do not include the oriented films in the first end region and the second end region.

9. The acoustic wave device according to claim 7, wherein the first electrode fingers and the second electrode fingers are directly on the piezoelectric substrate in the central region.

10. The acoustic wave device according to claim 7, wherein a low acoustic velocity region in which an acoustic velocity is lower than in the central region is provided in the first edge region and the second edge region of the IDT electrode.

11. The acoustic wave device according to claim 1, wherein
the first edge region includes a first end region including ends of the plurality of second electrode fingers, and the second edge region includes a second end region including ends of the plurality of first electrode fingers; and
the first electrode fingers and the second electrode fingers do not include the oriented films in the first end region and the second end region.

12. The acoustic wave device according to claim 11, wherein the first electrode fingers and the second electrode fingers are directly on the piezoelectric substrate in the central region.

13. The acoustic wave device according to claim 11, wherein a low acoustic velocity region in which an acoustic velocity is lower than in the central region is provided in the first edge region and the second edge region of the IDT electrode.

14. The acoustic wave device according to claim 1, wherein
the piezoelectric substrate includes a high velocity material layer and a piezoelectric layer directly or indirectly on the high velocity material layer; and
an acoustic velocity of bulk waves propagating through the high velocity material layer is higher than an acoustic velocity of acoustic waves propagating through the piezoelectric layer.

15. The acoustic wave device according to claim 14, wherein
the piezoelectric substrate includes a low velocity film between the high velocity material layer and the piezoelectric layer; and
an acoustic velocity of bulk waves propagating through the low velocity film is lower than an acoustic velocity of bulk waves propagating through the piezoelectric layer.

16. The acoustic wave device according to claim 14, wherein the high velocity material layer is a high velocity support substrate.

17. The acoustic wave device according to claim 14, wherein
the piezoelectric substrate includes a support substrate; and
the high velocity material layer is a high velocity film on the support substrate.

18. The acoustic wave device according to claim 1, wherein a low acoustic velocity region in which an acoustic velocity is lower than in the central region is provided in the first edge region and the second edge region of the IDT electrode.

19. The acoustic wave device according to claim 18, wherein a low acoustic velocity region in which an acoustic velocity is lower than in the central region is provided in the first edge region and the second edge region of the IDT electrode.

20. The acoustic wave device according to claim 1, wherein the first electrode fingers and the second electrode fingers are directly on the piezoelectric substrate in the central region.

* * * * *